(12) United States Patent
Yamashita et al.

(10) Patent No.: US 8,026,552 B2
(45) Date of Patent: Sep. 27, 2011

(54) PROTECTION ELEMENT AND FABRICATION METHOD FOR THE SAME

(75) Inventors: Yukihiro Yamashita, Osaka (JP); Keita Takahashi, Nara (JP)

(73) Assignee: Panasonic Corporation, Osaka (JP)

( * ) Notice: Subject to any disclaimer, the term of this patent is extended or adjusted under 35 U.S.C. 154(b) by 379 days.

(21) Appl. No.: 11/518,166

(22) Filed: Sep. 11, 2006

(65) Prior Publication Data

US 2007/0164327 A1 Jul. 19, 2007

(30) Foreign Application Priority Data

Jan. 19, 2006 (JP) ................................. 2006-011478

(51) Int. Cl.
*H01L 23/62* (2006.01)
(52) U.S. Cl. ................. 257/360; 257/300; 257/E29.345
(58) Field of Classification Search .................. 257/300, 257/E29.345, 355, 360
See application file for complete search history.

(56) References Cited

U.S. PATENT DOCUMENTS

| | | | |
|---|---|---|---|
| 4,907,058 A * | 3/1990 | Sakai | 257/371 |
| 6,869,844 B1 | 3/2005 | Liu et al. | |
| 2002/0040997 A1 | 4/2002 | Noguchi | |
| 2003/0001228 A1 | 1/2003 | Boivin et al. | |
| 2005/0250278 A1 | 11/2005 | Randolph | |
| 2008/0017926 A1 * | 1/2008 | Chiang et al. | 257/355 |

FOREIGN PATENT DOCUMENTS

| | | |
|---|---|---|
| JP | 59-125654 | 7/1984 |
| JP | 07-244991 | 9/1995 |
| JP | 2000-031477 | 1/2000 |
| JP | 2003-078052 | 3/2003 |
| JP | 2007-536731 | 12/2007 |
| WO | WO 2005/112120 A1 | 11/2005 |

OTHER PUBLICATIONS

Japanese Office Action issued in Japanese Patent Application No. JP 2006-011478 dated Jan. 11, 2011.

* cited by examiner

*Primary Examiner* — Colleen Matthews
(74) *Attorney, Agent, or Firm* — McDermott Will & Emery LLP (57) ABSTRACT

The protection element of the present invention is constructed of a MOS capacitor composed of a semiconductor substrate, an insulating film formed on the semiconductor substrate and a word line formed on the insulating film. A well region having a conductivity type opposite to that of the semiconductor substrate is formed in a portion of the semiconductor substrate constituting the MOS capacitor. If charge exceeding the breakdown voltage of the insulating film constituting the MOS capacitor is induced in the word line, the induced charge is released into either the semiconductor substrate or the well region depending on whether the induced charge is positive or negative.

9 Claims, 8 Drawing Sheets

PROTECTION ELEMENT AND FABRICATION METHOD FOR THE SAME

CROSS-REFERENCE TO RELATED APPLICATIONS

This application claims priority under 35 U.S.C. §119 on Patent Application No. 2006-011478 filed in Japan on Jan. 19, 2006, the entire contents of which are hereby incorporated by reference.

BACKGROUND OF THE INVENTION

The present invention relates to a protection element of a semiconductor device formed on a semiconductor substrate and a fabrication method for such a protection element.

Japanese Laid-Open Patent Publication No. 59-125654 describes a technology in which in a conventional semiconductor memory device including a MOS capacitor and a field effect transistor as an information memory unit (memory cell), a MOS capacitor having an insulating film of which breakdown voltage is relatively low compared with that of the MOS capacitor of the memory cell is used as a protection element.

Figure 7:
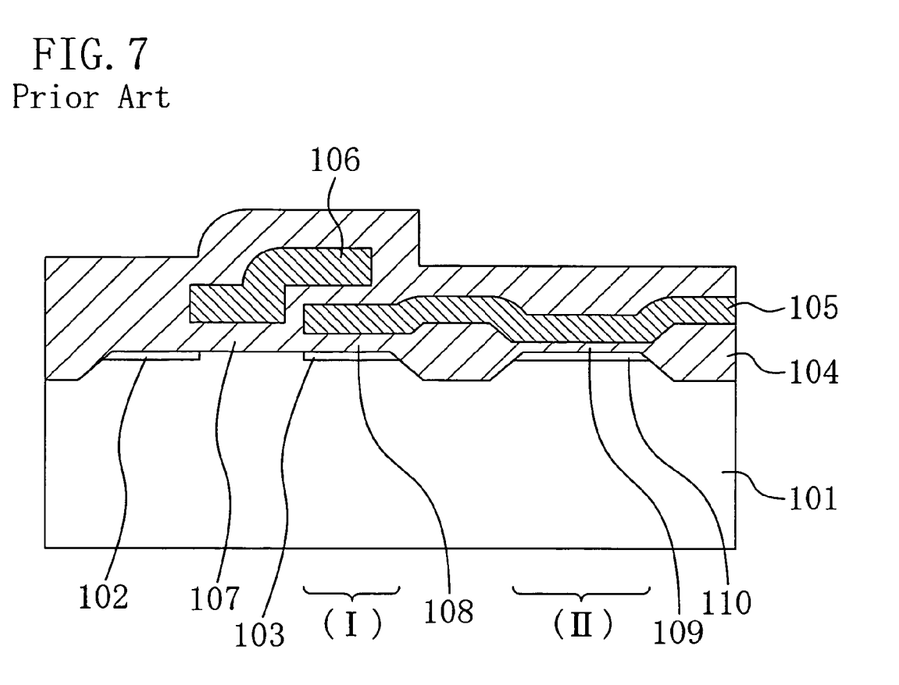
FIG. 7 is a cross-sectional view of a protection element of a conventional semiconductor memory device.

FIG. 7 is a cross-sectional view of the protection element of the semiconductor memory device described in the above patent publication. As shown in FIG. 7, a field effect transistor includes impurity diffusion layers 102 and 103 serving as the source/drain, and a second conductive layer 106 serving as the gate located above the impurity diffusion layers via a gate insulating film 107 made of a silicon dioxide film.

A MOS capacitor (I) in a memory cell is composed of the impurity diffusion layer 103 and a first conductive layer 105 with a dielectric layer 108 made of a silicon dioxide film interposed therebetween. A MOS capacitor (II) as the protection element is composed of the first conductive layer 105 and a reversal layer 110 with a silicon dioxide layer 109 thinner than the silicon dioxide layer of the MOS capacitor (I) in the memory cell interposed therebetween.

Once charge is induced in the first conductive layer 105, breakdown predominantly occurs in the MOS capacitor (II) as the protection element that is lower in breakdown voltage than the MOS capacitor (I) in the memory cell, causing the charge in the first conductive layer 105 to flow into a semiconductor substrate 101 via the MOS capacitor (II) as the protection element, preventing occurrence of further charging up. The MOS capacitor (I) in the memory cell is therefore protected.

SUMMARY OF THE INVENTION

However, in fabrication of a semiconductor memory device, in general, charge is induced in various process steps, including plasma process steps such as plasma etching and resist ashing performed to form gate electrodes, ion implantation process steps for making polysilicon constituting gate electrodes conductive and forming source/drain diffusion layers, and plasma etching process steps performed to form contact holes above gate electrodes and form metal wiring, for example.

Charge induced at such occasions may be positive or negative depending on the process steps. The breakdown voltage varies depending on the conductivity type of the semiconductor substrate located right under the MOS capacitor (II) as the protection element with respect to the polarity of the induced charge.

For example, when the conductivity type of the semiconductor substrate located right under the MOS capacitor (II) is n type, if positive charge is induced in the first conductive layer 105, an accumulation layer is formed right under the MOS capacitor (II). Hence, the MOS capacitor (II) has a breakdown voltage determined with the thickness of the silicon dioxide film 109.

When the conductivity type of the semiconductor substrate located right under the MOS capacitor (II) is p type, if positive charge is induced in the first conductive layer 105, a depletion layer is formed right under the MOS capacitor (II). Hence, the MOS capacitor (II) has a breakdown voltage determined with the serial capacitance of the silicon dioxide film 109 and the depletion layer.

As a result, the breakdown voltage is higher when the conductivity type of the semiconductor substrate is p type than when it is n type. In other words, if positive charge is induced when the conductivity type of the semiconductor substrate is p type, the induced charge is less likely to be dissipated.

This also applies to the case that negative charge is induced, in which the breakdown voltage varies depending on the conductivity type of the semiconductor substrate.

For example, when the conductivity type of the semiconductor substrate located right under the MOS capacitor (II) is n type, if negative charge is induced in the first conductive layer 105, a depletion layer is formed right under the MOS capacitor (II). Hence, the MOS capacitor (II) has a breakdown voltage determined with the serial capacitance of the silicon dioxide film 109 and the depletion layer.

When the conductivity type of the semiconductor substrate located right under the MOS capacitor (II) is p type, if negative charge is induced in the first conductive layer 105, an accumulation layer is formed right under the MOS capacitor (II). Hence, the MOS capacitor (II) has a breakdown voltage determined with the thickness of the silicon dioxide film 109.

As a result, the breakdown voltage is higher when the conductivity type of the semiconductor substrate is n type than when it is p type. In other words, if negative charge is induced when the conductivity type of the semiconductor substrate is n type, the induced charge is less likely to be dissipated.

Therefore, depending on the polarity of charge induced during a fabrication process step for a semiconductor memory device, the induced charge may possibly not be dissipated into the semiconductor substrate 101 but be accumulated in the first conductive layer 105.

If the charge induced during a fabrication process step is not dissipated into the semiconductor substrate 101 but is accumulated in the first conductive layer 105, the following problems may arise. That is, the induced charge may be trapped in the dielectric film of the MOS capacitor in the memory cell, and degradation in the reliability of the TDDB characteristic and the like of the dielectric film may occur. Moreover, the charge retention characteristic of the semiconductor memory device may be lowered.

In recent years, a MONOS nonvolatile semiconductor memory device having a memory structure of accumulating charge in an ONO film (oxide film/nitride film/oxide film) has attracted attention. If charge induced during a fabrication process step is trapped in a trapping gate insulating film made of an ONO film, problems as follows may arise. That is, the threshold voltage may vary among memory cell transistors, and deletion may not be performed completely.

An object of the present invention is providing a protection element capable of dissipating charge, positive or negative, induced during a fabrication process step for a semiconductor device with a breakdown voltage determined with the thickness of a dielectric film of a MOS capacitor.

The protection element according to the present invention is a protection element of a semiconductor device formed on a semiconductor substrate, the protection element comprising a MOS capacitor having the semiconductor substrate, an insulating film formed on the semiconductor substrate and a conductive film formed on the insulating film, wherein a first well region having a conductivity type opposite to that of the semiconductor substrate is formed in a portion of the semiconductor substrate constituting the MOS capacitor.

By being configured as described above, when charge exceeding the breakdown voltage of the insulating film constituting the MOS capacitor is induced in the conductive film, the induced charge can be released into either the semiconductor substrate or the first well region depending on whether the induced charge is positive or negative. Hence, the induced charge can be dissipated into the semiconductor substrate with the breakdown voltage determined with the thickness of the dielectric film of the MOS capacitor irrespective of the polarity of the charge induced during a fabrication process step for the semiconductor device. This makes it possible to prevent charge induced during a fabrication process step from being trapped in a dielectric film of a MOS capacitor in a memory cell, for example. This also makes it possible to prevent degradation in charge retention characteristic such as degradation in the reliability of the TDDB characteristic of the dielectric film.

In a preferred embodiment, the semiconductor device is a nonvolatile semiconductor memory device having MONOS memory cells, and the conductive film is a word line extending from the MONOS memory cells.

By being configured as described above, it is possible to prevent charge induced during a fabrication process step from being trapped in an ONO film and the like of memory cells, and thus suppress the threshold voltage from varying among memory cell transistors. It is also possible to prevent degradation in charge retention characteristic such as degradation in the reliability of the TDDB characteristic and the like of the ONO film due to the induced charge.

In a preferred embodiment, a first high-density impurity diffusion layer having the same conductivity type as the first well region is formed on the first well region, and the first high-density impurity diffusion layer partly extends on the surface of the semiconductor substrate adjacent to the first well region.

By being configured as described above, charge dissipated into the first well region can overpass a pn junction low in potential barrier formed between the first high-density impurity diffusion layer and the semiconductor substrate and be released into the semiconductor substrate comparatively easily.

In a preferred embodiment, a second high-density impurity diffusion layer having the same conductivity type as the semiconductor substrate is formed on the surface of the semiconductor substrate, and the second high-density impurity diffusion layer is adjacent to the first high-density impurity diffusion layer.

By being configured as described above, charge dissipated into the first well region can overpass a pn junction further low in potential barrier formed between the first high-density impurity diffusion layer and the second high-density impurity diffusion layer and be released into the semiconductor substrate further easily.

In a preferred embodiment, a conductive layer electrically connected to the first well region is provided, and the conductive layer is electrically connected to the semiconductor substrate adjacent to the first well region.

By being configured as described above, charge dissipated into the first well region can be swiftly released into the semiconductor substrate.

In a preferred embodiment, the breakdown voltage of the insulating film constituting the MOS capacitor is smaller than the breakdown voltage of an ONO film constituting a gate insulating film of the MONOS memory cells.

In a preferred embodiment, a second well region having the same conductivity type as the semiconductor substrate is formed in a portion of the semiconductor substrate constituting the MOS capacitor next to the first well region.

In a preferred embodiment, a third well region having a conductivity type opposite to that of the semiconductor substrate is formed in a portion of the semiconductor substrate, and the first well region and the second well region are located in the third well region.

The fabrication method for a protection element of the present invention is a fabrication method for a protection element of a nonvolatile semiconductor memory device having MONOS memory cells, the protection element including a MOS capacitor, wherein the MOS capacitor is formed by forming a well region having a conductivity type opposite to that of a semiconductor substrate in a protection element formation region of the semiconductor substrate, and then forming an insulating film and then a conductive film on the semiconductor substrate including the well region, and the conductive film is formed simultaneously with formation of a word line for the MONOS memory cells by extending the word line into the protection element formation region.

According to the protection element of the present invention, charge induced during a fabrication process step for the semiconductor device can be dissipated into the semiconductor substrate with the breakdown voltage determined with the thickness of the dielectric film of the MOS capacitor irrespective of the polarity of the induced charge. This makes it possible to prevent charge induced during a fabrication process step for a nonvolatile semiconductor device having MONOS memory cells, for example, from being trapped in an ONO film and the like of the memory cells, and thus suppress the threshold voltage from varying among memory cell transistors. This also makes it possible to prevent degradation in charge retention characteristic such as degradation in the reliability of the TDDB characteristic and the like of the ONO film due to the induced charge.

DESCRIPTION OF THE PREFERRED EMBODIMENTS

Hereinafter, preferred embodiments of the present invention will be described with reference to the accompanying drawings. In these drawings, components having substantially the same functions are denoted by the same reference numerals for simplification of description. It should be noted that the present invention is not limited to the embodiments to follow.

Embodiment 1

Figure 1A:
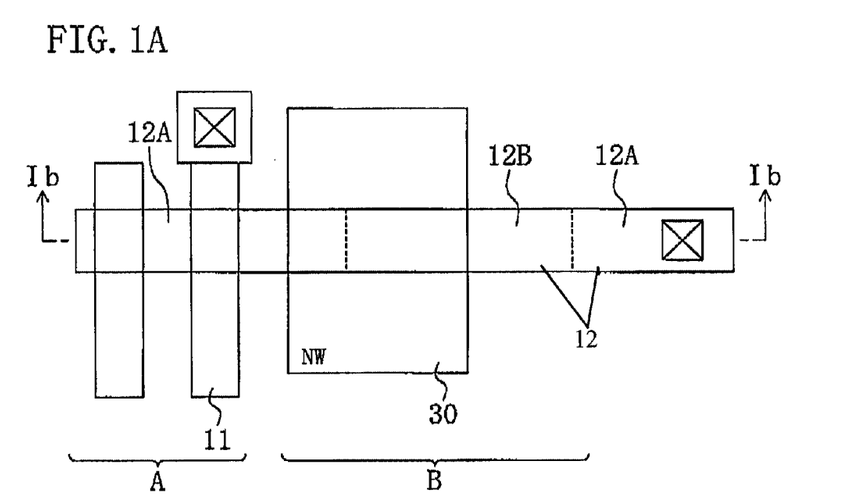
FIG. 1A is a diagrammatic plan view of a protection element of a nonvolatile semiconductor memory device in Embodiment 1 of the present invention.
Figure 1B:
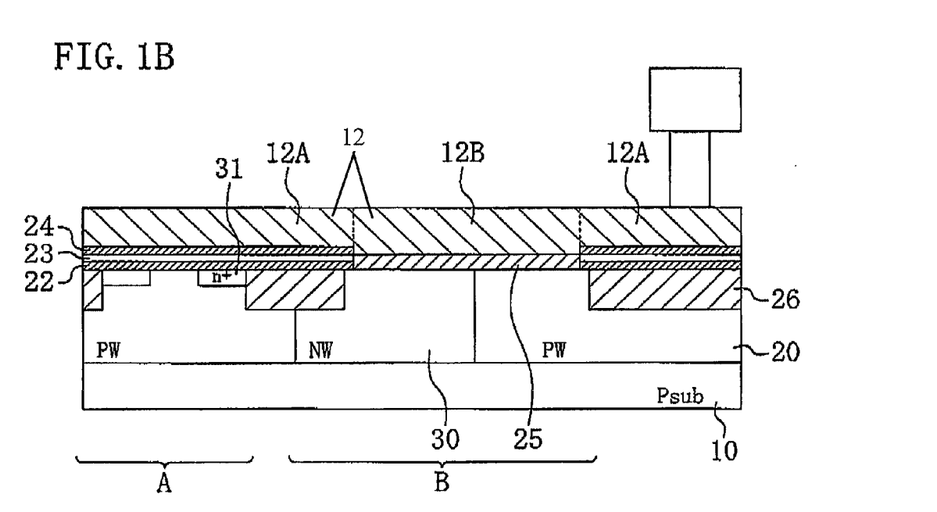
FIG. 1B is a cross-sectional view taken along line Ib-Ib of FIG. 1A.

FIG. 1A is a plan view diagrammatically showing a protection element of a nonvolatile semiconductor memory device in Embodiment 1 of the present invention, and FIG. 1B is a cross-sectional view taken along line Ib-Ib of FIG. 1A.

In the plan view of FIG. 1A, a MONOS memory cell is formed in an area where two bit lines 11 and a word line 12 cross each other. The MONOS memory cell includes a gate electrode and a gate insulating film made of an ONO film composed of a silicon oxide film 22, a silicon nitride film 23 and a silicon oxide film 24. Although omitted in FIG. 1A, memory cell transistors are generally arranged in an array in a memory cell region A.

A protection element region B includes an extended portion of the word line 12. A protection element is constructed of a MOS capacitor composed of a semiconductor substrate 10, an insulating film 25 formed on the semiconductor substrate 10 and a conductive film 12 formed on the insulating film 25. A first well region 30 having a conductivity type opposite to that of the semiconductor substrate 10 is formed in a portion of the semi-conductor substrate 10 constituting the MOS capacitor. The conductive film 12 is made of the word line 12 extending from the MONOS memory cell.

When the semiconductor substrate 10 is of p type, the first well region 30 will be an n-well region. In general, n$^+$ diffusion layers (bit line diffusion layers) 31 to serve as the source/drain regions of a transistor formed in the memory cell region A are formed in a p-well region. Therefore, a p-well region (second well region) 20 having the same conductivity type as the semiconductor substrate 10 may be formed next to the n-well region (first well region) 30 formed in the protection element region B.

The material of the insulating film 25 constituting the MOS capacitor is not specifically limited as long as the breakdown voltage of the insulating film 25 is smaller than the breakdown voltage of the ONO film constituting the gate insulating film of the MONOS memory cell.

The operation of the protection element constructed of the MOS capacitor shown in FIGS. 1A and 1B will be described.

As described above, charge is induced during a fabrication process step for a nonvolatile semiconductor memory device and accumulated in the word line 12, for example. Such induced charge may be positive or negative.

For example, if positive charge is accumulated in the word line 12, an accumulation layer is formed right under the portion of the word line 12 of the MOS capacitor formed in the n-well region (first well region) 30. On the contrary, a depletion layer is formed right under the portion of the word line 12 of the MOS capacitor formed in the p-type semiconductor substrate 10 (or p-well region 20), causing addition of the capacitance of the depletion layer to the capacitance of the MOS capacitor. Hence, the breakdown voltage of the MOS capacitor formed in the n-well region 30 is lower than the breakdown voltage of the MOS capacitor formed in the p-type semiconductor substrate 10 (or p-well region 20).

In reverse, if negative charge is accumulated in the word line 12, an accumulation layer is formed right under the portion of the word line 12 of the MOS capacitor formed in the p-type semiconductor substrate 10 (or p-well region 20). On the contrary, a depletion layer is formed right under the portion of the word line 12 of the MOS capacitor formed in the n-well region 30, causing addition of the capacitance of the depletion layer to the capacitance of the MOS capacitor. Hence, the breakdown voltage of the MOS capacitor formed in the p-type semiconductor substrate 10 (or p-well region 20) is lower than the breakdown voltage of the MOS capacitor formed in the n-well region 30.

From the operation principle described above, the protection element is switched ON at the time point when the charge accumulated in the word line 12, whether positive or negative, exceeds the breakdown voltage determined with the insulating film 25. In other words, charge induced during a fabrication process step is released into the semiconductor substrate 10 or the first well region 30 that is determined by whether the charge is positive or negative. This can prevent the induced charge from being trapped in the ONO film of the MONOS semiconductor memory device, and thus suppress the threshold voltage from varying among memory cell transistors. Also, degradation in the characteristics of the ONO film can be prevented, and thus the data retention characteristic of the MONOS semiconductor memory device can be improved.

Embodiment 2

As described above, induced charge accumulated in the word line 12, irrespective of the polarity of the charge, can be dissipated into the semiconductor substrate at the time point when the charge exceeds the breakdown voltage of the insulating film 25 of the MOS capacitor as the protection element. Desirably, charge dissipated into the first well region 30 should be finally released into the semiconductor substrate 10.

Actually, with existence of a pn junction between the first well region 30 and the semiconductor substrate 10, charge dissipated into the first well region 30 is to overpass the potential barrier of this pn junction to be released into the semiconductor substrate 10.

However, if charge dissipated into the first well region 30 is accumulated therein even temporarily, the potential of the first well region 30 may temporarily float, causing a rise of the threshold of the MOS capacitor, and this may possibly block release of charge accumulated in the word line 12. For this reason, charge dissipated into the first well region 30 should desirably be released into the semiconductor substrate 10 as soon as possible.

Embodiment 2 of the present invention proposes a method for releasing such charge dissipated into the first well region 30 into the semiconductor substrate 10 as soon as possible.

Figure 2A:
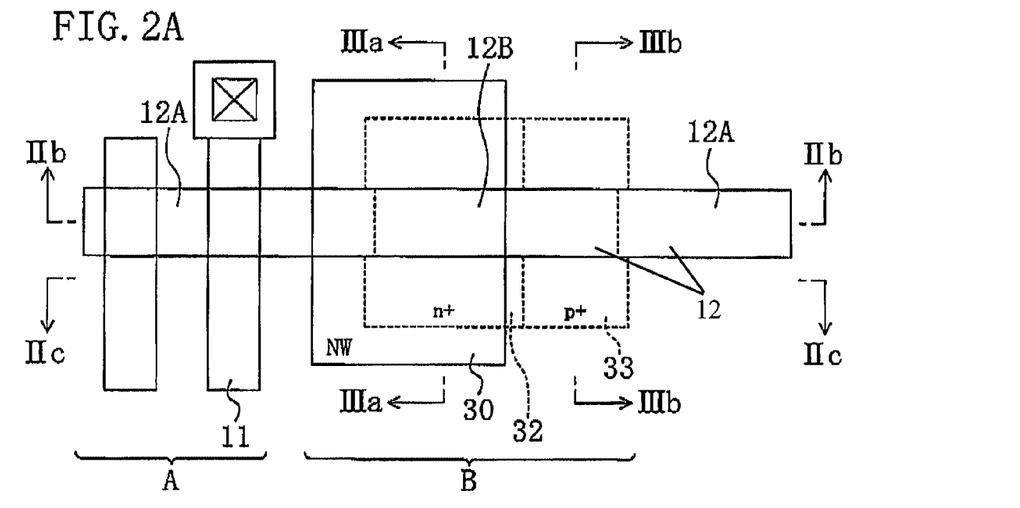
FIG. 2A is a diagrammatic plan view of a protection element of a nonvolatile semiconductor memory device in Embodiment 2 of the present invention.
Figure 2B:
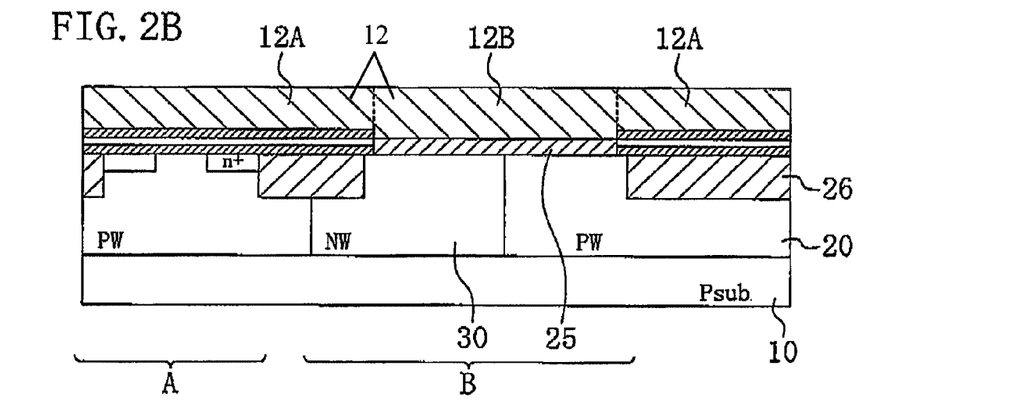
FIGS. 2B and 2C are respectively cross-sectional views taken along line IIb-IIb and line IIc-IIc of FIG. 2A.
Figure 2C:
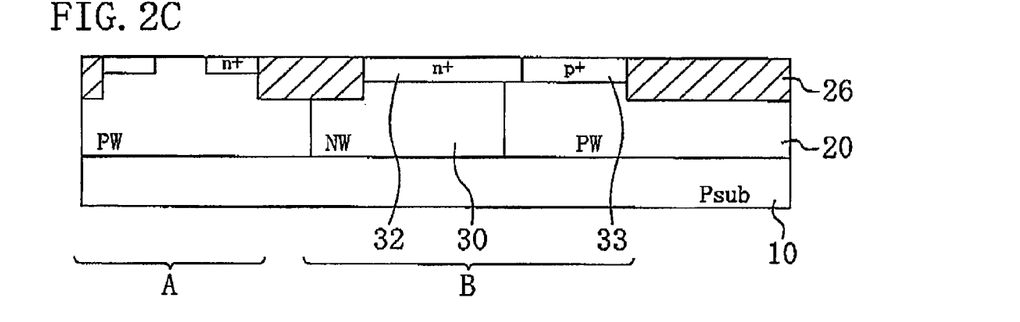
Figure 3A:
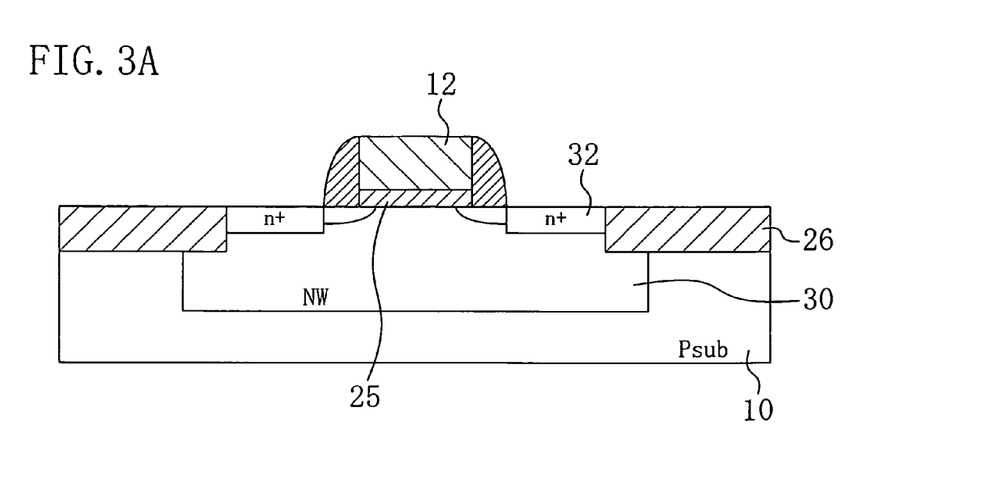
FIGS. 3A and 3B are views showing the protection element in Embodiment 2 of the present invention, taken along line IIIa-IIIa and line IIIb-IIIb, respectively, of FIG. 2A.
Figure 3B:
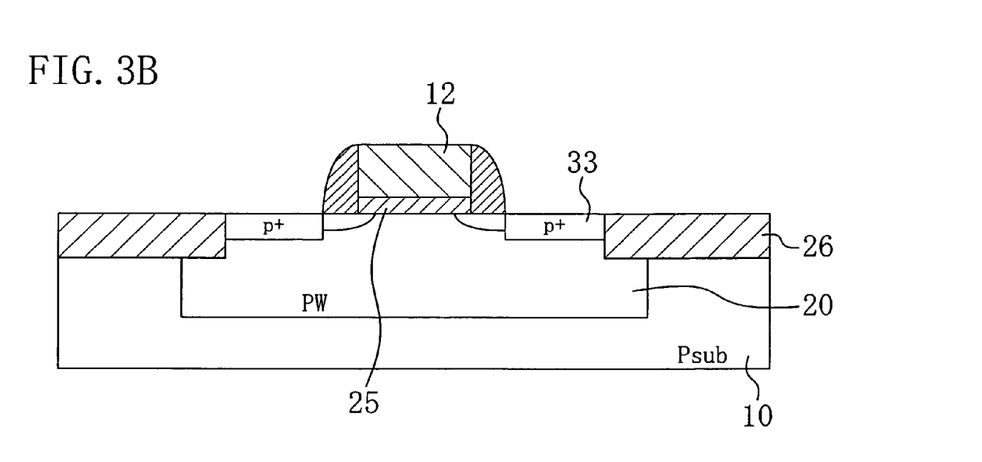

FIGS. 2A, 2B, 2C, 3A and 3B are views diagrammatically showing a protection element of a nonvolatile semiconductor memory device in this embodiment, in which FIG. 2A is a plan view, and FIGS. 2B, 2C, 3A and 3B are respectively cross-sectional views taken along line IIb-IIb, line IIc-IIc, line IIIa-IIIa and line IIIb-IIIb of FIG. 2A.

This embodiment is the same in basic configuration as Embodiment 1 shown in FIGS. 1A and 1B, but is different therefrom in that a first high-density impurity diffusion layer ($n^+$ diffusion layer) 32 of the same conductivity type as the first well region (n-well region) 30 is formed on the surface of the first well region 30 and the first high-density impurity diffusion layer 32 partly extends on the surface of the semiconductor substrate 10 (or second well region 20).

With the $n^+$ diffusion layer 32 formed on the surface of the n-well region, a new $pn^+$ junction can be formed between the $n^+$ diffusion layer 32 and the p-type semiconductor substrate 10 (or p-well region 20). This $pn^+$ junction is lower in junction breakdown voltage than the pn junction between the n-well region 30 and the p-type semiconductor substrate 10 (or p-well region 20). Therefore, charge dissipated into the n-well region 30 can overpass this $pn^+$ junction low in potential barrier to allow the charge to be released into the semiconductor substrate 10 comparatively easily.

A second high-density impurity diffusion layer ($p^+$ diffusion layer) 33 of the same conductivity type as the semiconductor substrate 10 may further be formed on the surface of the semiconductor substrate 10 next to the first high-density impurity diffusion layer ($n^+$ diffusion layer) 32.

With the $p^+$ diffusion layer 33 formed next to the $n^+$ diffusion layer 32, a $p^+n^+$ junction can further be formed between the $p^+$ diffusion layer 33 and the $n^+$ diffusion layer 32. This $p^+n^+$ junction is lower in junction breakdown voltage than the $pn^+$ junction between the $n^+$ diffusion layer 32 and the p-type semiconductor substrate 10 (or p-well region 20). Therefore, charge dissipated into the n-well region 30 can overpass this $p^+n^+$ junction low in potential barrier to allow the charge to be released into the semiconductor substrate 10 more easily.

The first high-density impurity diffusion layer ($n^+$ diffusion layer) 32 and the second high-density impurity diffusion layer ($p^+$ diffusion layer) 33 can be formed simultaneously with formation of diffusion layers to serve as sources/drains of transistors constituting a periphery circuit, for example. No additional step is therefore necessary.

The above method is directed to additionally providing a pn junction lower in junction breakdown voltage than the pn junction between the n-well region 30 and the p-type semiconductor substrate 10 (or p-well region 20). In this relation, as shown in FIG. 4, a conductive layer 34 may further be formed on the $n^+$ diffusion layer 32 and the $p^+$ diffusion layer 33 constituting the additional pn junction.

With the formation of the conductive layer 34, charge dissipated into the n-well region can be released swiftly into the p-type semiconductor substrate 10 via the conductive layer 34. The conductive layer 34 can be formed simultaneously with formation of a metal silicide layer on diffusion layers to serve as source/drain regions of transistors constituting a peripheral circuit, for example, if such a metal silicide layer is formed.

Figure 4:
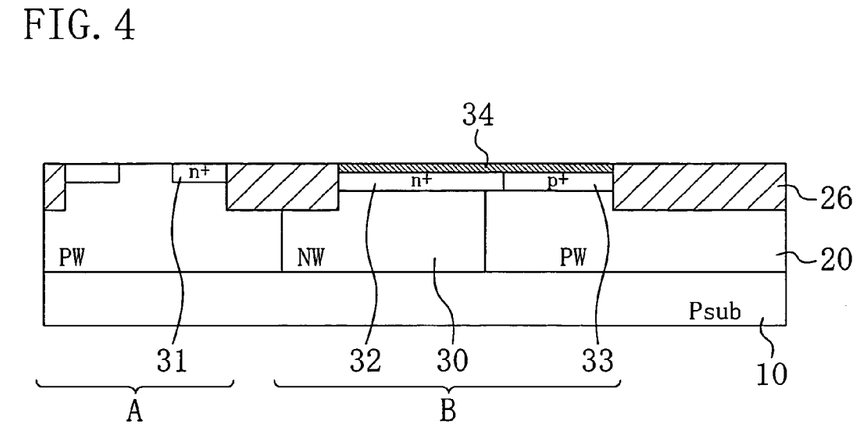
FIG. 4 is a cross-sectional view of another example of the protection element in Embodiment 2 of the present invention.

In FIG. 4, the $n^+$ diffusion layer 32 and the $p^+$ diffusion layer 33 are formed on the surface of the semiconductor substrate 10. However, this formation of the $n^+$ diffusion layer 32 and the $p^+$ diffusion layer 33 is unnecessary if contact with the n-well region 30 is secured. Also, a means other than the conductive layer 34, such as local wiring, may be adopted if such electric connection that allows the n-well region 30 and the semiconductor substrate 10 (or p-well region 20) to be at the same potential is obtained.

Next, a fabrication method for a protection element (MOS capacitor) in an embodiment of the present invention will be described with reference to FIGS. 5A through 5F. FIGS. 5A through 5F are cross-sectional views showing process steps of the fabrication method, taken along line IIb-IIb of FIG. 2A.

Note that the protection element (MOS capacitor) in Embodiment 1 will be fabricated by following the process steps in this embodiment other than the process steps of forming the first and second high-density impurity diffusion layers 32 and 33.

Figure 5A:
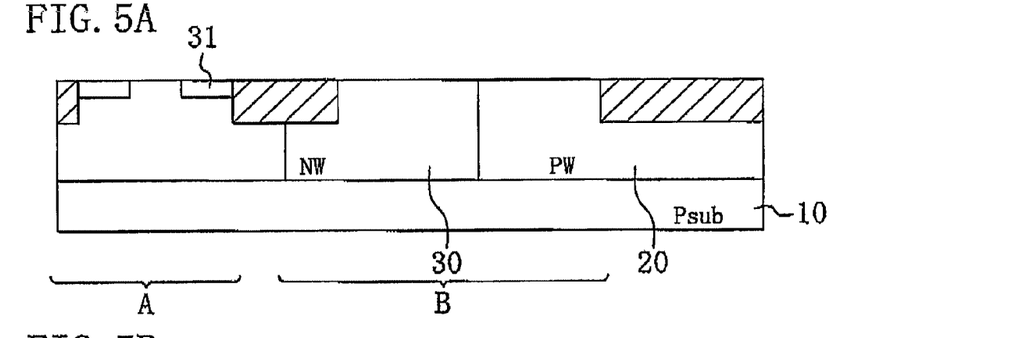
FIGS. 5A through 5F are cross-sectional views showing process steps of a fabrication method for a protection element in an embodiment of the present invention.

First, as shown in FIG. 5A, after formation of device isolation regions 26 in the p-type semiconductor substrate 10, the n-well region 30 having a conductivity type opposite to that of the p-type semiconductor substrate 10 is formed in the protection element formation region B. In the protection element formation region B, the p-well region 20 may also be formed next to the n-well region 30 simultaneously with formation of a p-well region in the memory cell region A. In the memory cell region A, bit line diffusion layers 31 are formed.

Figure 5B:
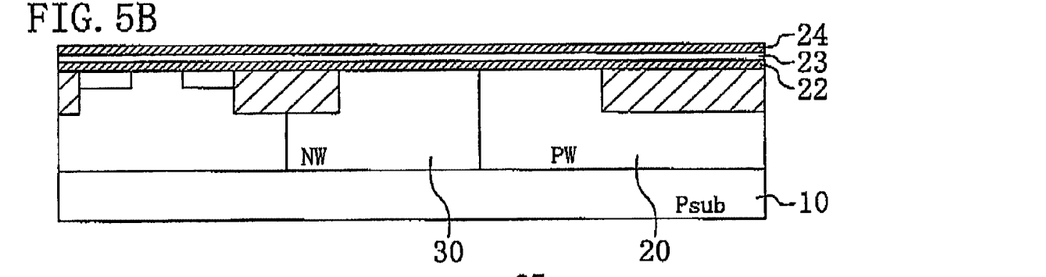

As shown in FIG. 5B, on the surface of the semiconductor substrate 10, the silicon oxide film 22, the silicon nitride film 23 and the silicon oxide film 24 are sequentially deposited to form the ONO film, which constitutes a gate insulating film of each MONOS memory cell. The thicknesses of the deposited layers of the ONO film are about 5 nm/10 nm/10 nm, respectively.

Figure 5C:
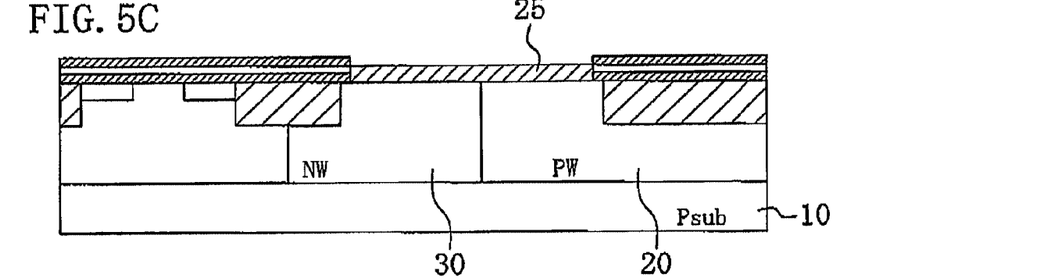

As shown in FIG. 5C, the portion of the ONO film in the protection element region B is etched away, and the exposed surface of the semiconductor substrate 10 is oxidized to form the insulating film 25 constituting the protection element (MOS capacitor). The insulating film 25 is formed to have a thickness with which the breakdown voltage thereof is smaller than that of the ONO film, such as a thickness of about 18 nm, for example.

Figure 5D:
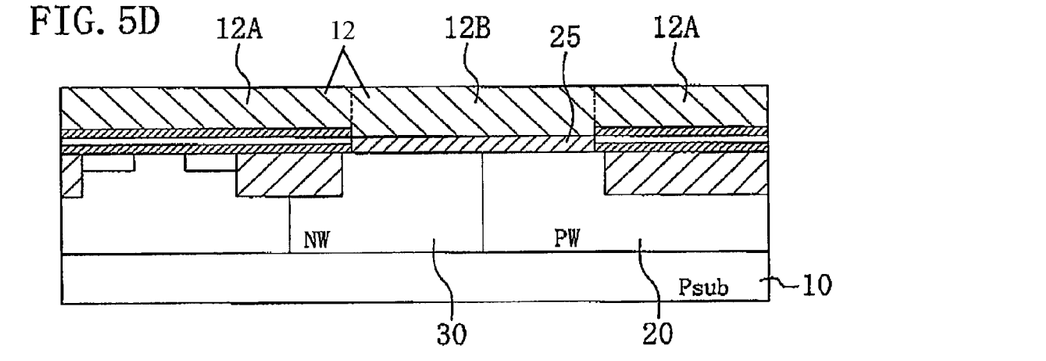

As shown in FIG. 5D, the word line 12 is formed in the memory cell region A of the semiconductor substrate 10, so as to extend into the protection element formation region B. The word line 12 is formed of a polysilicon film.

Figure 5E:
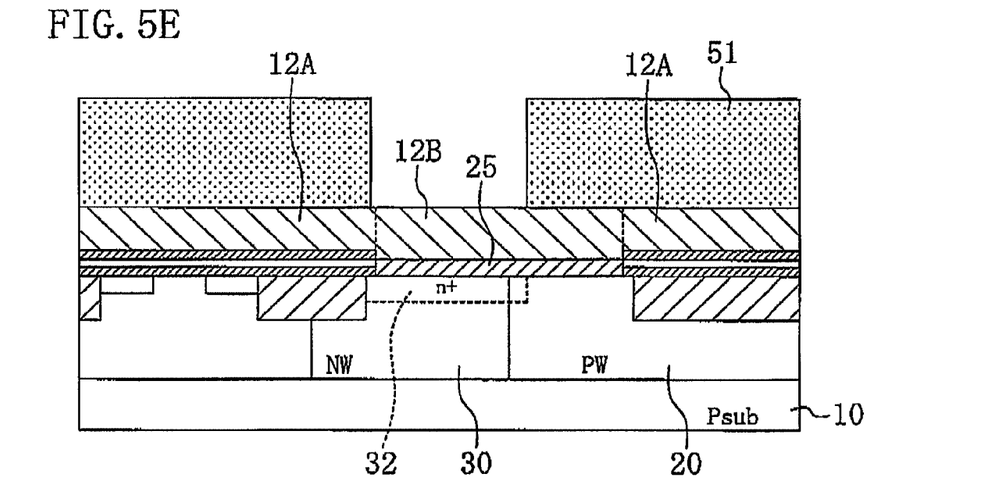

As shown in FIG. 5E, the $n^+$ diffusion layer 32 (shown by the dot line) is formed on the surface of a portion of the n-well region 30 on which the word line 12 does not exist by ion implantation using a resist mask 51 having an opening corresponding to an appropriate portion of the protection element region B. The $n^+$ diffusion layer 32 is formed to extend into the p-well region 20 adjacent to the n-well region 30.

Figure 5F:
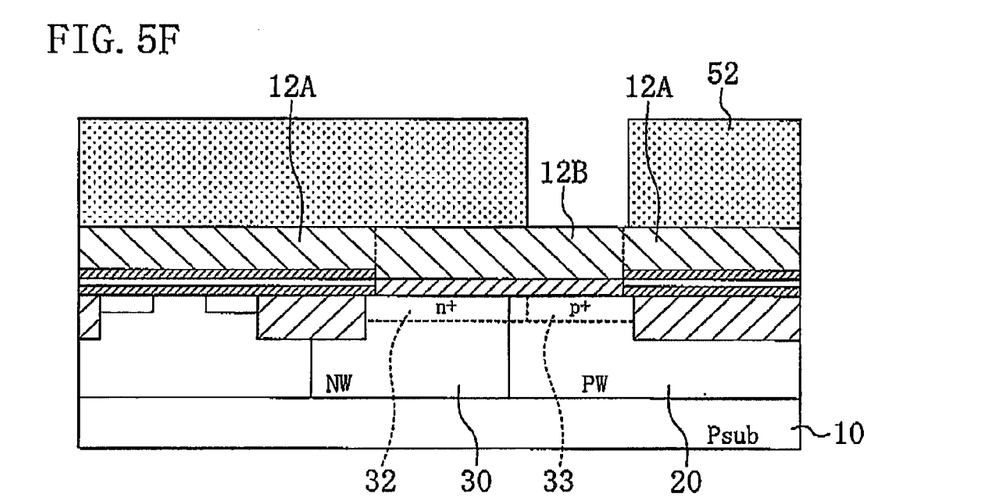

Finally, as shown in FIG. 5F, the $p^+$ diffusion layer 33 is formed next to the $n^+$ diffusion layer 32 by ion implantation using a resist mask 52 having an opening corresponding to an appropriate portion of the protection element region B.

In the case of further forming the conductive layer 34 on the $n^+$ diffusion layer 32 and the $p^+$ diffusion layer 33 as shown in FIG. 4, a metal film is deposited on the surface of the semiconductor substrate 10 and then heat-treated to silicidize the surfaces of the $n^+$ diffusion layer 32 and the $p^+$ diffusion layer 33 to thereby form the conductive layer 34 in a self-alignment manner.

Alteration to Embodiment 2

Figure 6A:
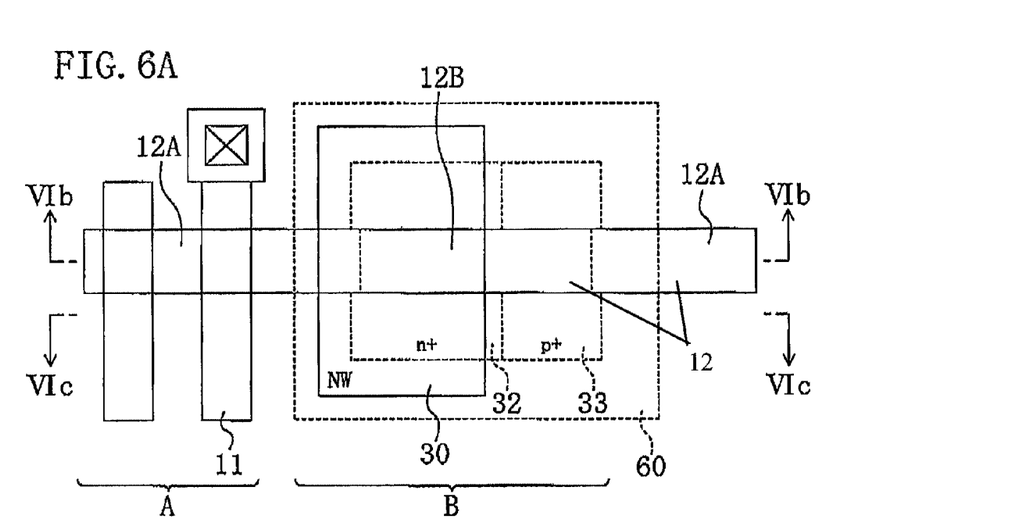
FIG. 6A is a plan view of an alteration to Embodiment 2 of the present invention.
Figure 6B:
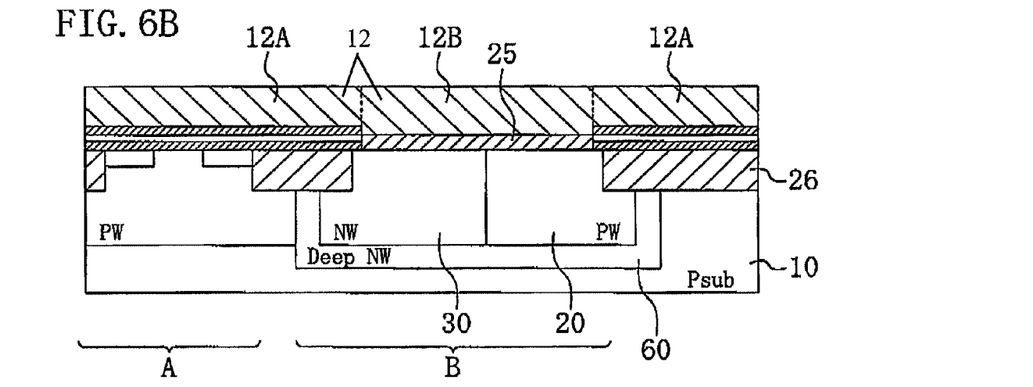
FIGS. 6B and 6C are respectively cross-sectional views taken along line VIb-VIb and line VIc-VIc of FIG. 6A.
Figure 6C:
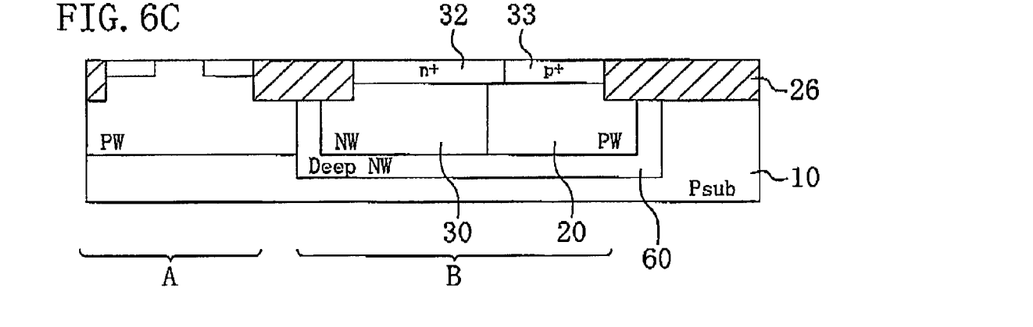

FIGS. 6A to 6C show an alteration to Embodiment 2 of the present invention, in which FIG. 6A is a plan view and FIGS. 6B and 6C are respectively cross-sectional views taken along line VIb-VIb and line VIc-VIc of FIG. 6A.

A feature of this alteration is that a third well region (deep n-well region) 60 having a conductivity type opposite to that of the semiconductor substrate 10 is formed so as to surround the n-well region (first well region) 30 and the p-well region (second well region) 20 formed in the protection element region B.

With the formation of the third well region 60, a substrate bias can be given to the n-well region 30 and the p-well region 20 of the protection element independently of the memory cell region A, and thus the ON voltage for the MOS capacitor can be set at a desired voltage.

While the present invention has been described in preferred embodiments, it will be apparent to those skilled in the art that the embodiments described above are not restrictive and may be modified in numerous ways. For example, although a nonvolatile semiconductor memory device was exemplified to describe the present invention in the above embodiments, it is needless to mention that substantially the same effect can also be obtained in other semiconductor devices. It is therefore intended by the appended claims to cover all modifications of the invention which fall within the true spirit and scope of the invention.

What is claimed is:

1. A protection element of a semiconductor device formed on a semiconductor substrate,
the semiconductor device including:
the semiconductor substrate;
a gate insulating film formed on the semiconductor substrate; and
a word line formed on the gate insulating film,
the protection element comprising a MOS capacitor having:
the semiconductor substrate;
an insulating film formed on the semiconductor substrate and having a lower breakdown voltage than the gate insulating film; and
an extended portion of the word line formed on the insulating film, wherein:
a first well region having a conductivity type opposite to that of the semiconductor substrate is formed in a portion of the semiconductor substrate constituting the MOS capacitor, and
the insulating film is formed in contact with both a surface of the semiconductor substrate and a surface of the first well region.

2. The protection element of claim 1, wherein when charge exceeding the breakdown voltage of the insulating film constituting the MOS capacitor is induced in the word line and the extended portion of the word line, the induced charge is released into either the semiconductor substrate or the first well region depending on whether the induced charge is positive or negative.

3. The protection element of claim 1, wherein the semiconductor device is a nonvolatile semiconductor memory device having MONOS memory cells,
the word line is a word line of the MONOS memory cell, and
the extended portion of the word line is a word line extending from the MONOS memory cells.

4. The protection element of claim 1, wherein a first high-density impurity diffusion layer having the same conductivity type as the first well region is formed on the first well region,
the first high-density impurity diffusion layer partly extends on the surface of the semiconductor substrate adjacent to the first well region, and
the insulating film is formed in contact with both the surface of the semiconductor substrate and a surface of the first high-density impurity diffusion layer.

5. The protection element of claim 4, wherein a second high-density impurity diffusion layer having the same conductivity type as the semiconductor substrate is formed on the surface of the semiconductor substrate,
the second high-density impurity diffusion layer is adjacent to the first high-density impurity diffusion layer, and
the insulating film is formed in contact with both the surface of the first high-density impurity diffusion layer and a surface of the second high-density impurity diffusion layer.

6. The protection element of claim 1, wherein
a conductive layer is formed in contact with the surface of the first well region and the surface of
the semiconductor substrate adjacent to the first well region.

7. The protection element of claim 3, wherein the breakdown voltage of the insulating film constituting the MOS capacitor is smaller than breakdown voltage of an ONO film constituting a gate insulating film of the MONOS memory cells.

8. The protection element of claim 1, wherein a second well region having the same conductivity type as the semiconductor substrate is formed in a portion of the semiconductor substrate constituting the MOS capacitor next to the first well region, and
the insulating film is formed in contact with both the surface of the first well region and a surface of the second well region.

9. The protection element of claim 8, wherein a third well region having a conductivity type opposite to that of the semiconductor substrate is formed in a portion of the semiconductor substrate, and
the first well region and the second well region are located in the third well region.

* * * * *